(12) United States Patent
Sharma et al.

(10) Patent No.: US 8,804,438 B2
(45) Date of Patent: Aug. 12, 2014

(54) MEMORY DEVICE

(75) Inventors: Ashish Sharma, New Delhi (IN); Amit Kumar Gupta, Greater Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 262 days.

(21) Appl. No.: 13/567,035

(22) Filed: Aug. 4, 2012

(65) Prior Publication Data

US 2014/0036602 A1 Feb. 6, 2014

(51) Int. Cl.
*G11C 7/10* (2006.01)

(52) U.S. Cl.
USPC .............. 365/189.05; 365/185.2; 365/185.25; 365/233.1

(58) Field of Classification Search
USPC .................. 365/189.05, 185.2, 185.25, 233.1
See application file for complete search history.

(56) References Cited

U.S. PATENT DOCUMENTS

| | | | | |
|---|---|---|---|---|
| 5,369,620 A | * | 11/1994 | Sugibayashi | ............ 365/189.04 |
| 5,694,353 A | * | 12/1997 | Koike | ............................ 365/145 |
| 5,933,366 A | * | 8/1999 | Yoshikawa | ................ 365/185.03 |
| 5,936,888 A | * | 8/1999 | Sugawara | ................... 365/185.2 |
| 6,285,604 B1 | | 9/2001 | Chang | |
| 6,483,754 B1 | | 11/2002 | Agrawal | |
| 6,687,183 B2 | | 2/2004 | Peterson | |
| 6,711,092 B1 | | 3/2004 | Sabharwal | |
| 6,804,141 B1 | * | 10/2004 | Rickes et al. | ................. 365/145 |
| 6,870,777 B2 | | 3/2005 | Maki | |
| 6,999,345 B1 | * | 2/2006 | Park et al. | ............... 365/185.18 |
| 7,400,543 B2 | | 7/2008 | Brown | |
| 7,458,005 B1 | | 11/2008 | Shubat | |
| 7,940,545 B2 | | 5/2011 | Sharma | |
| 8,040,746 B2 | | 10/2011 | Jain | |
| 8,223,572 B2 | | 7/2012 | Jain | |
| 2008/0101114 A1 | * | 5/2008 | Kim et al. | ..................... 365/174 |
| 2010/0208506 A1 | | 8/2010 | Rana | |
| 2010/0208538 A1 | | 8/2010 | Gupta | |
| 2010/0271893 A1 | * | 10/2010 | Lee | ............................. 365/207 |
| 2011/0211382 A1 | | 9/2011 | Sharma | |

* cited by examiner

*Primary Examiner* — Tuan T Nguyen
(74) *Attorney, Agent, or Firm* — Charles Bergere

(57) ABSTRACT

A memory device that accurately tracks memory operations includes a vertical loopback for tracking a sense clock signal to a row address decoder, and read and write reference bit lines in a reference column that include loopbacks for vertically tracking a selected bit line during read and write operations. Preferably the widths of word lines and a sense line are equal to enable the sense line to horizontally track any selected word line. The memory device also includes tri-state input/output (I/O) latches to latch sense amplifier outputs. A drive circuit of the tri-state I/O latch is disabled when the output is available at the corresponding sense amplifier and enabled when the output is latched by the latch circuit.

20 Claims, 2 Drawing Sheets

MEMORY DEVICE

BACKGROUND OF THE INVENTION

The present invention generally relates to memory devices, and more particularly, to tracking memory paths in memory devices.

Referring to FIG. 1, a circuit diagram of a conventional memory device 100 is shown. The memory device 100 includes an internal clock line 102, a plurality of memory arrays including first and second memory arrays 104a and 104b, a first pre-charge transistor 106, a first transmission gate 108, a row address decoder (XDEC) 110, a reference column 112, a sense signal generator 114, a reset clock line 116, a sense amplifier 118, and a pre-charge line 120. A clock generator (not shown) generates internal clock signals in the memory device 100 that traverse along the internal clock line 102. The first and second memory arrays 104a and 104b include a plurality of bit line columns 122, one of which is shown. The bit line column 122 includes a plurality of bit lines 124, one of which is shown. The bit line 124 is connected to a plurality of bit cells (or memory cells) that are further connected to a plurality of word lines (not shown). The reference column 112 includes a reference bit line (RBL) 126. The sense signal generator 114 includes a second pre-charge transistor 128 and a second transmission gate 130.

The bit line 124 and the RBL 126 are pre-charged to a first predefined threshold voltage by a pre-charge signal (PRCH) generated by the pre-charge line 120 before a read operation. Pre-charging of the bit line 124 and the RBL 126 results in a high read current and a fast read operation. The first pre-defined threshold voltage depends on the voltage ($V_{DD}$) applied to the memory device 100 and usually about 90 to 98 percent of the applied voltage $V_{DD}$. The bit line 124 and the RBL 126 are pre-charged by the first and second pre-charge transistors 106 and 128, respectively. Drain terminals of both the pre-charge transistors 106 and 128 are connected to the voltage ($V_{DD}$) line. The internal clock signal is provided to the XDEC 110 to start the read operation, which generates a word line enable right (WLR) signal 132a and a word line enable left (WLL) signal 132b, to enable one or more of the plurality of word lines.

The clock generator further generates a sense clock signal that initiates discharging of the RBL 126 on reaching the reference column 112. The reference column 112 includes reference bit cells that are connected to the RBL 126 and track the bit line 124 by way of the sense clock signal in the reference column 112. The bit line 124 and the RBL 126 discharge to a second predefined threshold voltage to create a required potential difference ($\Delta V$) on the bit line 124, and he first transmission gate 108 selects the bit line 124, and the second transmission gate 130 selects the RBL 126. The second predefined threshold voltage is the voltage at which the sense amplifier 118 needs to be activated to generate an output of the read operation on sensing $\Delta V$.

Thereafter, the sense signal generator 114 generates a reset clock signal on the reset clock line 116, and a sense amplifier enable right (SAER) signal 134a and a sense amplifier enable left (SAEL) signal 134b when the RBL 126 discharges to the second pre-defined threshold voltage. The SAER and SAEL signals 134a and 134b enable the sense amplifier 118 to read the data stored on the bit line 124. The output of the bit line 124 is denoted by Q.

The memory device 100 includes two functional paths that are activated at the beginning of a memory read operation. The first functional path performs the actual memory operation and is the path traversed by the internal clock signal to the XDEC 110, paths traversed by the WLR and WLL signals 132a and 132b, the enabled word line, and the bit line 124 and is referred to as 'memory operation path'. The second path enables the sense amplifier 118 using the SAER and SAEL signals 134a and 134b, resets the memory device 100 and is the path traversed by the sense clock signal to the reference column 112, and that traversed by the SAER and SAEL signals 134a and 134b to the sense amplifier 118. The second path is referred to as 'self-time path'. For proper and accurate execution of read/write operations and resetting of the memory after the operation, it is important that the self-time path accurately tracks the memory operation path.

FIG. 2 shows a schematic block diagram of a conventional memory device 200, in which a self-time path is shown. The memory device 200 includes a local control circuit 202, a row address decoder (XDEC) 204, a reference column 206, a memory array 208, a sense amplifier 210 and a sense line 212. The local control circuit 202 includes a clock generator 214 for generating internal clock and sense clock signals, and a sense signal generator 216 for generating sense enable and write completion signals for read and write operations respectively. The reference column 206 includes a read reference bit line (read RBL) 218 and a write reference bit line (write RBL) 220. The memory array 208 includes a plurality of bit line columns 222, one of which is shown, and the bit line column 222 includes a plurality of bit lines 224, one of which is shown. The bit line 224 is connected to a plurality of bit cells that are further connected to a plurality of word lines 226, one of which is shown.

The memory read/write operation starts with the clock generator 214 simultaneously generating the internal and sense clock signals on receiving a memory clock signal. In the memory operation path, the internal clock signal reaches the XDEC 204 in time T1, a word line enable signal generated by the XDEC 204 enables the word line 226 and initiates discharging of the bit line 224 in time T2, and the bit line 224 discharges in time T3. Therefore, the total time required for the completion of the memory read/write operation is T1+T2+T3. In the self-time path, the sense clock signal reaches the reference column 206 and initiates discharging of the read RBL 218 or the write RBL 220, based on whether a memory read or write operation are being performed. The sense enable signal/write completion signal is generated by the sense signal generator 216 once the read RBL 218 is discharged to $\Delta V$ or the write RBL 220 is discharged to the defined write margin. The sense enable signal traverses the sense line 212 to enable the sense amplifier 210 and the sense enable/write completion signal resets the memory device 200 for the next operation. The circuit associated with the self-time path is referred to as a 'self-time circuit' and includes the self-time path, the reference column 206, the sense signal generator 216, and the sense line 212.

Reference bit cells are connected to the read RBL 218/write RBL 220 to track the bit line 224. In other words, the time T3 required for discharging the bit line 224 is tracked by discharging the read RBL 218/write RBL 220. However, the tracking is not accurate since resistances of the bit line 224 and read RBL 218/write RBL 220 do not match. Further, the time T2 required to enable the bit line 224 after generation of the word line enable signal cannot be tracked accurately by the sense enable signal because of the mismatch in the resistances and capacitances (RC) of the word line 226 and the sense line 212. Moreover, the self-time path does not track time T1. Therefore, the self-time path takes time equal to roughly T2+T3 as opposed to time T1+T2+T3 taken by the memory operation path.

Different memory devices operate in different configurations and generate different aspect ratios based on the bit cell being selected from the memory array 208 for a memory operation. The mismatch between the memory path and the self-time path changes with a change in the aspect ratios. For example, the time mismatch because of T2 is maximum at far ends and minimum at near ends of the word line 226 and the sense line 212 and results in a considerable difference in the ΔV/write margin values at the far and near ends. In addition, voltage and temperature changes affect the RC delays of the word line 226 and sense line 212 differently, contributing to further time mismatch between the two paths.

The time mismatch between the memory operation and self-time paths introduces inconsistencies in ΔV or write margins and lowers the performance of the memory device 200 in terms of output accuracy, timing, and power consumption. For example, activating the sense amplifier 210 when ΔV is less than the required voltage may result in a failure of the read operation. Further, activating the sense amplifier 210 when ΔV is more than the required voltage increases the memory access time and power consumption of the sense amplifier 210. Similarly, slow write completion may increase the write operation time and power consumption or result in a failure of the write operation because of violation of the write cycle time, whereas faster write completion may result in a failure of the write operation. Thus, the self-time circuit in the memory device 200 does not track the memory operation accurately and does not account for variations in the timing mismatch that occurs due to different aspect ratios, varying voltages and temperature effects on the timing critical paths, and process variations on the bit cells and the sense amplifier 210.

Therefore, there is a need for a memory device with a self-time circuit that accurately tracks memory read/write operations, that adapts to different aspect ratios and process variations of the memory device, that achieves a fast reset of the memory device, and that overcome the above-mentioned limitations of existing memory devices.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

Figure 1:
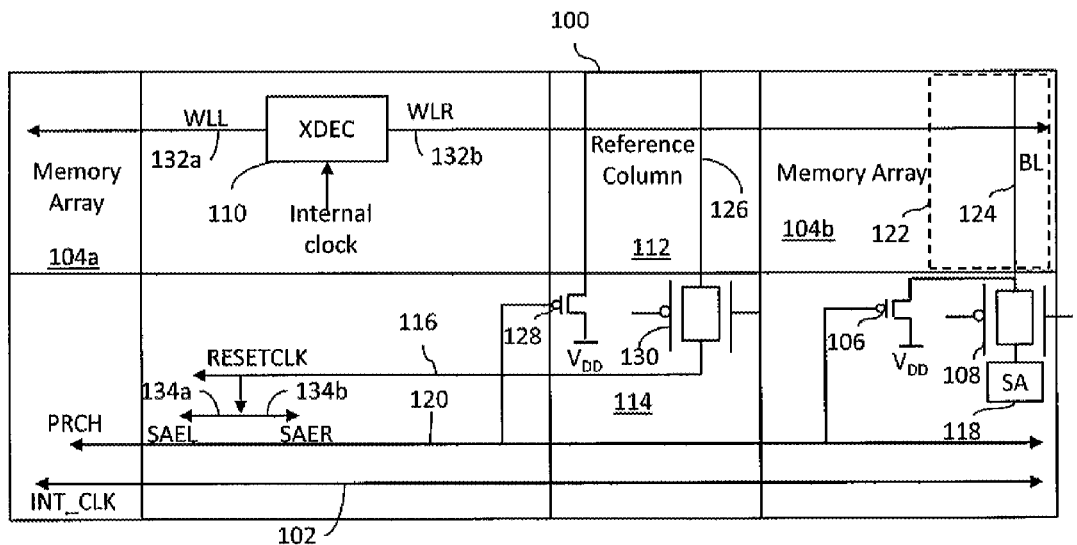
FIG. 1 is a schematic diagram of a conventional memory device.
Figure 2:
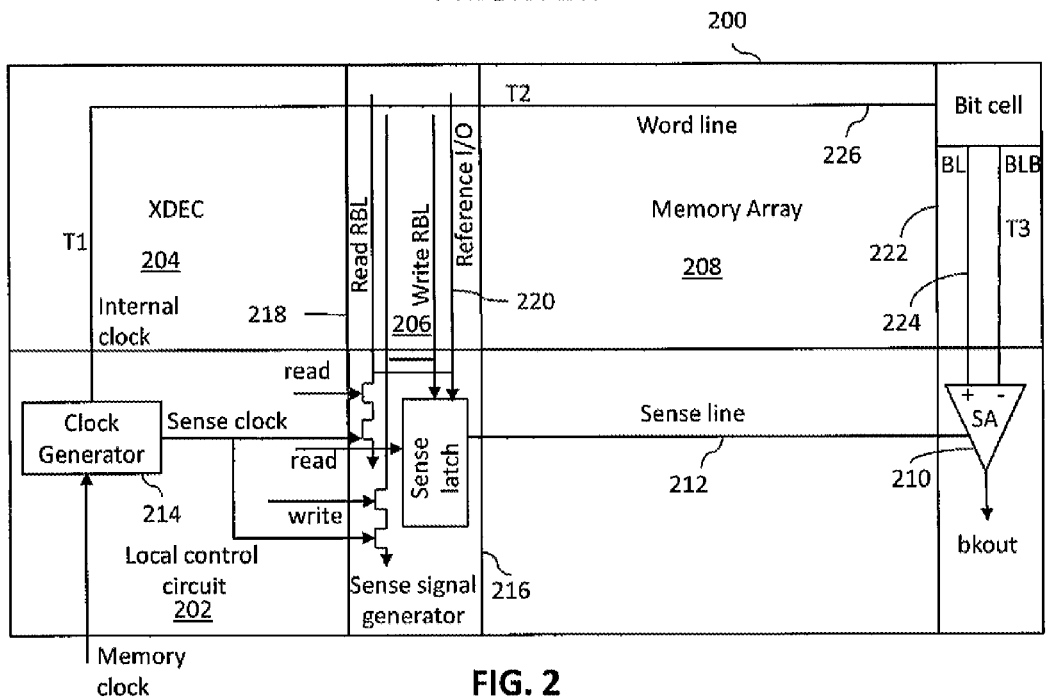
FIG. 2 is a schematic block diagram of a conventional memory device in which a self-timed path is shown.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a memory device is provided. The memory device includes a memory array that includes a plurality of bit line columns connected to a plurality of bit lines. Each bit line column includes a plurality of bit cells that are connected to corresponding plurality of word lines. A row address decoder generates a word line enable signal for selecting a word line and a bit line for discharging. A plurality of sense amplifiers sense corresponding plurality of bit lines. A reference bit line column is provide that includes a read reference bit line that vertically tracks the bit line using a first pre-defined loopback during a read operation and a write reference bit line that vertically tracks the bit line using a second pre-defined loopback during a write operation. The memory device further includes a control circuit that includes pre-charge, clock and sense signal generators. The pre-charge generator generates a pre-charge signal to pre-charge the selected bit line, the read reference bit line for the read operation, and the write reference bit line for the write operation. The clock generator simultaneously generates an internal clock signal for the row address decoder and a sense clock signal for enabling discharging of the read reference bit line during the read operation and discharging of the write reference bit line during the write operation. The sense clock signal vertically tracks the internal clock signal to the row address decoder, using a third pre-defined loopback. The sense signal generator generates a strobe signal and a sense enable signal for activating a sense amplifier corresponding to the bit line for performing the read operation, when the read reference bit line is discharged. The sense enable signal horizontally tracks the word line using a sense line, as widths of the sense line and the word line are substantially equal. The memory device further includes tri-state input/output (I/O) latches that are connected to the sense amplifiers. A tri-state I/O latch includes a latch circuit for latching an output of the sense amplifier, and a driver circuit for driving the latch circuit. The tri-state I/O latch is controlled using the strobe signal, such that the driver circuit is disabled when the output is available at the sense amplifier and enabled when the output is latched by the latch circuit.

Various embodiments of the present invention provide a memory device for accurately tracking the timing of memory operations in a memory device. The memory operations are tracked by accurately tracking the paths followed by the internal clock, word line, and data-out signals, which ensures stable memory operation across different device configurations without compromising on the area and design margins. Accurate tracking of the paths and timing is achieved by matching vertical and horizontal lengths and widths of the self-time path with the memory operation path as well as by matching the RC delays. In addition, loading of the memory operation path is matched with loading of the self-time path by attaching dummy loads to the self-time path. Thus, the total time of the self-time path is matched with the time of the memory operation path, which ensures stable and accurate memory operation of the memory device.

Figure 3:
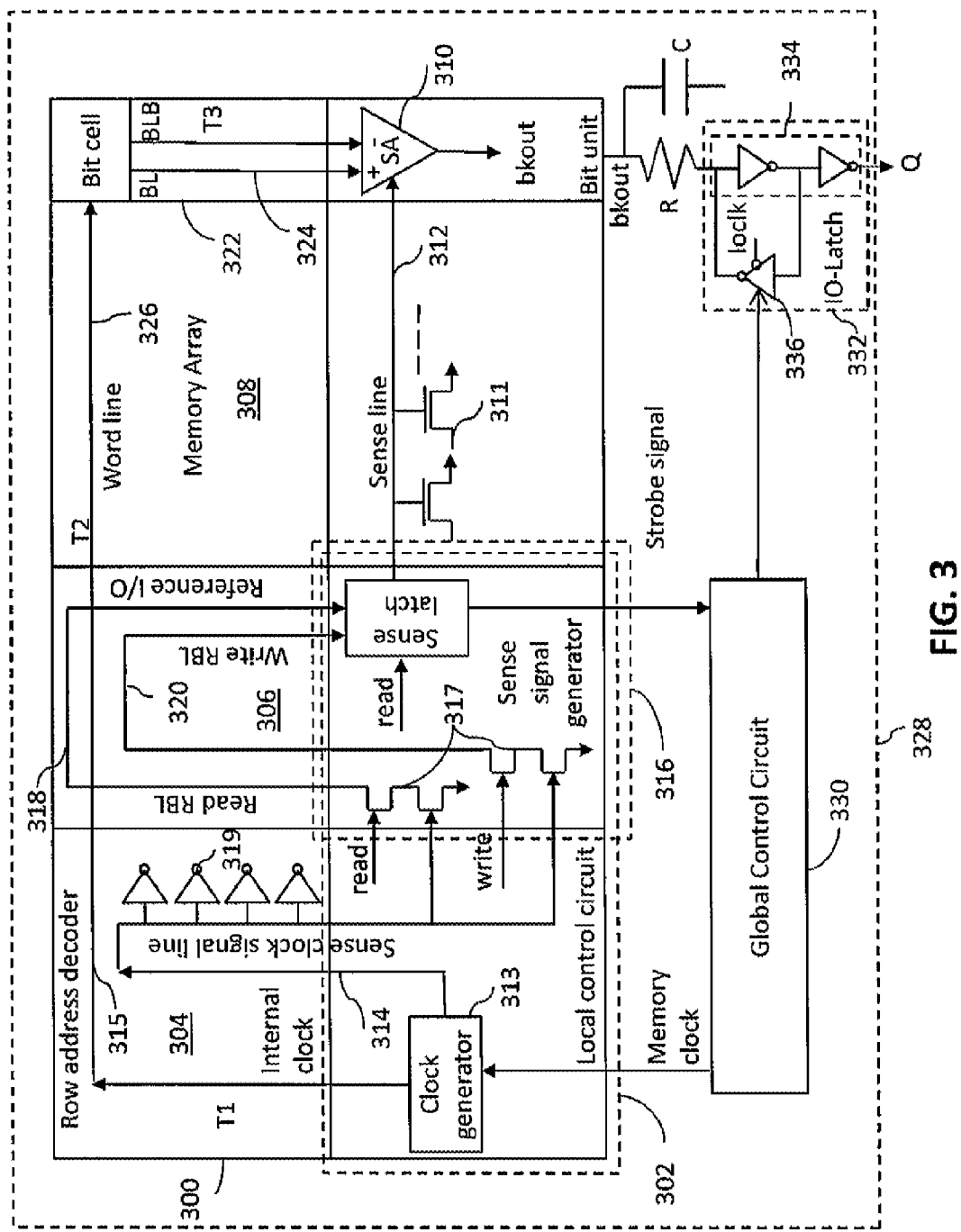
FIG. 3 is a schematic block diagram illustrating a self-timed path in a memory device in accordance with an embodiment of the present invention.

Referring now to FIG. 3, a schematic block diagram illustrating a self-time path in a memory device 300, in accordance with an embodiment of the present invention, is shown. Examples of the memory device 300 include random access memories (RAMs), read only memories (ROMs), dynamic-RAMs (DRAMs), and flash memories. The memory device 300 includes a local control circuit 302, a row address decoder (XDEC) 304, a reference column 306, a memory array 308, a sense amplifier 310, and a sense line 312. The local control circuit 302 includes a clock generator 313 for generating internal and sense clock signals, a sense clock signal line 314 and a sense signal generator 316 for generating sense enable and write completion signals for read and write operations respectively. The sense signal generator 316 includes a plurality of reference pull down cells 317. The reference column 306 includes a plurality of reference bit cells (not shown), a read reference bit line (read RBL) 318 and a write reference bit line (write RBL) 320 that include first and second loopbacks, respectively. As used herein, the term loopback refers to a physical path that routes a signal back to the point from where it originates. The memory array 308 includes a plurality of bit line columns 322, one of which is shown, and a bit line column 322 includes a plurality of bit lines 324, one of which is shown. The bit line 324 is connected to a plurality of bit cells that are further connected to a plurality of word lines 326, one of which is shown. In an embodiment of the present invention, the number of reference bit cells is equal to the number of bit cells connected to a single bit line 324. The memory device 300 may be a part of a plurality of memory devices (not shown in FIG. 3) that form a memory block 328. The memory block 328 further includes a global control circuit 330 and a plurality of tri-state input/output (I/O) latches 332 corresponding to the plurality of memory devices 300. The global control circuit 330 generates a memory clock signal to activate/deactivate the memory device 300.

The bit line 324 and the read RBL 318/write RBL 320 are pre-charged to a first predefined threshold voltage by a precharge generator (not sown in FIG. 3) before a memory read/write operation. The read RBL 318 is charged before a read operation and write RBL 320 is charged before a write operation. The memory read/write operation starts with the clock generator 313 generating the internal and sense clock signals simultaneously, on receiving the memory clock signal. The XDEC 304 generates a word line enable signal 315 to enable one of the word lines 326 on receiving the internal clock signal. The word line enable signal 315 enables the word line 326 and initiates discharging of the bit line 324. The sense clock signal traverses a third loopback of the sense clock signal line 314 and initiates discharging of the read RBL 318 for the read operation or the write RBL 320 for the write operation by way of the reference pull down cells 317. The first and second loopbacks of the read and write RBLs 318 and 320 vertically track the bit line 324 during the read and write operations, respectively. Dummy loads 319 are attached to the sense clock signal line 314 to match the loading of the sense and internal clock signals, which enables the sense clock signal to vertically track the internal clock signal to the XDEC 304. Examples of the dummy loads 319 include capacitors and gates including complimentary metal-oxide-semiconductor (CMOS) gates that can be connected as capacitors. The CMOS gates have the same length and width as that of the gates in the vertical path, to match the loading. When the read RBL 318 is discharged, the sense signal generator 316 generates the sense clock signal for activating the sense amplifier 310 to perform the read operation. The sense signal generator 316 simultaneously generates a strobe signal. The sense enable signal traverses the sense line 312 to activate the sense amplifier 310. In various embodiments of the present invention, the word line 326 is designed to have a substantially similar width as that of the sense line 312, to match the RC delays thereof. However, it is ensured that the width of the word line 326 is more than the minimum width required by the technology used to manufacture the memory device 300. Further, dummy loads 311 are attached to the sense line 312 to match the capacitance thereof with the capacitance of the word line 326, which enables the sense line 312 to horizontally track the word line 326.

The sense amplifier 310 senses the value stored in the bit line 324 and provides an output signal (bkout) to the tri-state I/O latch 332. The tri-state I/O latch 332 includes a latch circuit 334 for latching the bkout signal and a driver circuit 336 for driving the latch circuit 334. The driver circuit 336 is controlled by the strobe signal. The strobe signal is provided to the global control circuit 330 for resetting the memory device 300 when the memory operation is complete. An I/O clock signal that is derived from the strobe signal is provided to the driver circuit 336. The sense enable, strobe and I/O clock signals are synchronized. The I/O clock signal controls the driver circuit 336, such that the driver circuit 336 is disabled when the bkout signal is available at the sense amplifier 310 and enabled when the bkout signal is latched by the latch circuit 334. Simultaneous generation of the sense enable and strobe signals synchronizes the I/O clock signal with the bkout signal at the I/O latch. The synchronization is further ensured by approximately similar vertical and horizontal paths traversed by the strobe and I/O clock signals together, and the sense enable and bkout signals together. The synchronization ensures that the driver circuit 336 offers no resistance when the latch circuit 334 latches the bkout signal. The driver circuit 336 further offers a resistance for a stable output when the bkout signal is latched. The I/O latch 332 provides the latched value as the output of the read operation. The synchronization also ensures that the memory device 300 is reset as soon as the memory operation is complete as the global control circuit 330 resets the memory device 300 based on the strobe signal. For a write operation, the write RBL 320 is activated in a similar manner as the read RBL 318. Write driver circuits (not sown in FIG. 3) initiate the write operation to a selected bit cell. Discharge of the write RBL 320 along with the generation of the strobe signal completes the write operation.

In the memory operation path for the read operation, the internal clock signal reaches the XDEC 304 in time T1, the word line enable signal 315 generated by the XDEC 304 enables the word line 326 and initiates discharging of the bit line 224 in time T2, and the bit line discharges in time T3. Thus, the total time required for the memory read operation is T1+T2+T3. In the self-time path, the sense clock signal traverses the third loopback in time T1 (as the third loopback vertically tracks the internal clock signal to the XDEC 304), the read RBL 318 or the write RBL 320 discharges in time T3 (as the read RBL 318 and the write RBL 320 vertically track the bit line 324), and the sense enable signal activates the sense amplifier 310 in time T2 (as the sense line 312 horizontally tracks the word line 326 by way of matched RC delay and loading). Therefore, the total time required in the self-time path is matched with the time required by the memory operation path, which ensures stable and accurate memory operations of the memory device 300.

The memory device of the present invention accurately tracks the memory read/write operations across different device configurations and aspect ratios, by tracking the horizontal and vertical paths during in the memory read/write operations. Voltage and temperature effects remain the same across both the memory operation and self-time paths because of matched RC delays and loads. The reference pull down cells 317 are designed to operate accurately across extreme process variations of the bit cells and sense amplifiers 310. In addition, the present invention enables timely resetting of the memory device 300 to achieve fast memory read/write operations, less power consumption, and accurate tracking without compromising on device design margins.

While various embodiments of the present invention have been illustrated and described, it will be clear that the present The invention is not limited to these embodiments only. Numerous modifications, changes, variations, substitutions, and equivalents will be apparent to those skilled in the art, without departing from the spirit and scope of the present invention, as described in the claims.

The invention claimed is:

1. A memory device, comprising:
    a memory array that includes a plurality of bit line columns connected to a corresponding plurality of bit lines, wherein each bit line column includes a plurality of bit cells, and wherein the plurality of bit cells are connected to a corresponding plurality of word lines;
    a row address decoder for generating a word line enable signal for selecting at least one word line and at least one bit line for discharging;
    a plurality of sense amplifiers connected to and for sensing the plurality of bit lines;
    a reference column comprising a read reference bit line for vertical tracking of the selected at least one bit line using a first pre-defined loopback during a read operation and a write reference bit line for vertical tracking of the selected at least one bit line using a second pre-defined loopback during a write operation; and
    a control circuit, including:
        a pre-charge generator for generating a pre-charge signal to pre-charge the read reference bit line for the read operation, the write reference bit line for the write operation, and the selected at least one bit line;
        a clock generator for generating an internal clock signal for the row address decoder and a sense clock signal for enabling discharge of the read reference bit line during the read operation and the write reference bit line during the write operation, wherein the sense clock signal vertically tracks the internal clock signal to the row address decoder using a third pre-defined loopback; and
        a sense signal generator for generating a sense enable signal for activating a sense amplifier of the plurality of sense amplifiers corresponding to the selected at least one bit line for performing the read operation when the read reference bit line is discharged, wherein the sense enable signal horizontally tracks the selected at least one word line using a sense line, and wherein widths of the sense line and the at least one word line are substantially the same.

2. The memory device of claim 1, wherein the sense signal generator further generates a strobe signal for resetting the memory device when either of the read reference bit line or the write reference bit line is discharged.

3. The memory device of claim 2, further comprising a plurality of tri-state input/output (I/O) latches connected to the plurality of sense amplifiers, wherein each tri-state I/O latch includes:
    a latch circuit for latching an output of a corresponding one of the sense amplifiers; and
    a drive circuit for driving the latch circuit, wherein the strobe signal controls the drive circuit during the read operation.

4. The memory device of claim 3, wherein the drive circuit is disabled by the strobe signal when the sense amplifier output is available and enabled when the sense amplifier output is latched by the latch circuit.

5. The memory device of claim 1, wherein the reference column comprises a plurality of reference bit cells for the read and write operations, wherein the plurality of reference bit cells are equal in number to the number of bit cells connected to the selected at least one bit line.

6. The memory device of claim 1, wherein the third pre-defined loopback includes a plurality of dummy loads attached thereto that match loading of the sense signal and the internal clock signal.

7. The memory device of claim 1, wherein the sense line includes a plurality of dummy loads attached thereto to match the capacitance of the sense line with a capacitance of the selected at least one word line.

8. The memory device of claim 1, wherein the clock generator generates the internal clock signal and the sense clock signal substantially simultaneously.

9. A memory device, comprising:
    a memory array that includes a plurality of bit line columns connected to corresponding plurality of bit lines, wherein each bit line column includes a plurality of bit cells, and wherein the plurality of bit cells are connected to a corresponding plurality of word lines;
    a row address decoder for generating a word line enable signal for selecting at least one word line of the plurality of word lines and at least one bit line of the plurality of bit lines for discharging;
    a plurality of sense amplifiers connected to and for sensing corresponding ones of the plurality of bit lines;
    a reference column comprising a read reference bit line for vertical tracking of the selected at least one bit line using a first pre-defined loopback during a read operation and a write reference bit line for vertical tracking of the selected at least one bit line using a second pre-defined loopback during a write operation; and
    a control circuit, including:
        a pre-charge generator for generating a pre-charge signal to pre-charge the read reference bit line for the read operation and the write reference bit line for the write operation and the selected at least one bit line;
        a clock generator for substantially simultaneously generating an internal clock signal for the row address decoder and a sense clock signal for enabling discharge of the read reference bit line during the read operation and the write reference bit line during the write operation, wherein the sense clock signal vertically tracks the internal clock signal to the row address decoder using a third pre-defined loopback; and
        a sense signal generator for substantially simultaneously generating a sense enable signal for activating one of the plurality of sense amplifiers corresponding to the selected at least one bit line for performing the read operation when the read reference bit line is discharged and a strobe signal for resetting the memory device when either one of the read or write reference bit lines is discharged, wherein the sense enable signal horizontally tracks the selected at least one word line using a sense line, wherein widths of the sense line and the selected at least one word line are substantially the same; and
    a plurality of tri-state input/output (I/O) latches connected to corresponding ones of the plurality of sense amplifiers, wherein each tri-state I/O latch includes:
        a latch circuit for latching an output of the corresponding one of the sense amplifiers; and
        a drive circuit for driving the latch circuit, wherein the drive circuit is enabled and disabled by the strobe signal.

10. The memory device of claim 9, wherein the drive circuit is disabled by the strobe signal when the sense amplifier output is available and enabled when the sense amplifier output is latched by the latch circuit.

11. The memory device of claim 9, wherein the reference column comprises a plurality of reference bit cells for the read and write operations, wherein the plurality of reference bit cells are equal in number to the number of bit cells connected to the selected at least one bit line.

12. The memory device of claim 9, wherein the third pre-defined loopback includes a plurality of dummy loads attached thereto to match loading of the sense signal and the internal clock signal.

13. The memory device of claim 9, wherein the sense line includes a plurality of dummy loads attached thereto to match the capacitance of the sense line with a capacitance of the selected at least one word line.

14. The memory device of claim 9, wherein the memory device comprises at least one of RAM, ROM, DRAM, and flash memory.

15. A memory device, comprising:
- a memory array that includes a plurality of bit line columns connected to a corresponding plurality of bit lines, wherein each bit line column includes a plurality of bit cells, and wherein the plurality of bit cells are connected to a corresponding plurality of word lines;
- a row address decoder for generating a word line enable signal for selecting at least one word line and at least one bit line for discharging;
- a plurality of sense amplifiers connected to and for sensing corresponding ones of the plurality of bit lines;
- a reference column comprising a read reference bit line for vertical tracking of the selected at least one bit line using a first pre-defined loopback during a read operation and a write reference column comprising a write reference bit line for vertical tracking of the selected at least one bit line using a second pre-defined loopback during a write operation; and
- a control circuit, including:
  - a pre-charge generator for generating a pre-charge signal to pre-charge the read reference bit line for the read operation, the write reference bit line for the write operation, and the selected at least one bit line;
  - a clock generator for substantially simultaneously generating an internal clock signal for the row address decoder and a sense clock signal for enabling discharge of the read reference bit line during the read operation and the write reference bit line during the write operation, wherein the sense clock signal vertically tracks the internal clock signal to the row address decoder using a third pre-defined loopback; and
  - a sense signal generator for generating a sense enable signal for activating the one of the plurality of sense amplifiers corresponding to the selected at least one bit line for performing the read operation when the read reference bit line is discharged, wherein the sense enable signal horizontally tracks the selected at least one word line using a sense line, wherein widths of the sense line and the selected at least one word line are substantially equal and wherein the sense line includes a plurality of dummy loads attached thereto to match the capacitance thereof with capacitance of the selected at least one word line.

16. The memory device of claim 15, wherein the sense signal generator further generates a strobe signal for resetting the memory device when either one of the read reference bit line or the write reference bit line is discharged.

17. The memory device of claim 16, further comprising a plurality of tri-state input/output (I/O) latches connected to corresponding ones of the plurality of sense amplifiers, wherein each tri-state I/O latch includes:
- a latch circuit for latching an output of the corresponding sense amplifier; and
- a drive circuit for driving the latch circuit, wherein the drive circuit is disabled by the strobe signal when the output of the sense amplifier is available and enabled when the sense amplifier output is latched by the latch circuit during the read operation.

18. The memory device of claim 15, wherein the reference column comprises a plurality of reference bit cells for the read and write operations, wherein the plurality of reference bit cells are equal in number to the number of bit cells connected to the selected at least one bit line.

19. The memory device of claim 15, wherein the third pre-defined loopback includes a plurality of dummy loads attached thereto to match loading of the sense signal and the internal clock signal.

20. The memory device of claim 15, wherein the memory device comprises at least one of RAM, ROM, DRAM, and flash memory.

* * * * *